United States Patent
Sofer et al.

(10) Patent No.: US 7,187,595 B2
(45) Date of Patent: Mar. 6, 2007

(54) REPLENISHMENT FOR INTERNAL VOLTAGE

(75) Inventors: Yair Sofer, Tel-Aviv (IL); Ori Elyada, Hod Hasharon (IL); Yoram Betser, Mazkeret Batya (IL)

(73) Assignee: Saifun Semiconductors Ltd., Netanya (IL)

( * ) Notice: Subject to any disclaimer, the term of this patent is extended or adjusted under 35 U.S.C. 154(b) by 441 days.

(21) Appl. No.: 10/862,404

(22) Filed: Jun. 8, 2004

(65) Prior Publication Data

US 2006/0039219 A1 Feb. 23, 2006

(51) Int. Cl.
*G11C 5/14* (2006.01)
(52) U.S. Cl. ............................ 365/189.09; 365/185.18; 365/226; 327/548
(58) Field of Classification Search ........... 365/189.09, 365/185.18, 226; 327/548
See application file for complete search history.

(56) References Cited

U.S. PATENT DOCUMENTS

| | | |
|---|---|---|
| 4,961,010 A | 10/1990 | Davis |
| 5,029,063 A | 7/1991 | Lingstaedt et al. |
| 5,081,371 A | 1/1992 | Wong |
| 5,142,495 A | 8/1992 | Canepa |
| 5,142,496 A | 8/1992 | Van Buskirk |
| 5,276,646 A | 1/1994 | Kim et al. |
| 5,280,420 A | 1/1994 | Rapp |
| 5,381,374 A | 1/1995 | Shiraishi et al. |
| 5,534,804 A | 7/1996 | Woo |
| 5,553,030 A | 9/1996 | Tedrow et al. |
| 5,559,687 A | 9/1996 | Nicollini et al. |
| 5,581,252 A | 12/1996 | Thomas |
| 5,612,642 A | 3/1997 | McClintock |
| 5,636,288 A | 6/1997 | Bonneville et al. |
| 5,663,907 A | 9/1997 | Frayer et al. |
| 5,672,959 A | 9/1997 | Der |
| 5,675,280 A | 10/1997 | Nomura et al. |
| 5,708,608 A | 1/1998 | Park et al. |
| 5,717,581 A | 2/1998 | Canclini |
| 5,726,946 A | 3/1998 | Yamagata et al. |

(Continued)

FOREIGN PATENT DOCUMENTS

EP 0693781 1/1996

(Continued)

OTHER PUBLICATIONS

Martin, "Improved Circuits for the Realization of Switched-Capacitor Filters", IEEE Transactions on Circuits and Systems, Apr. 1980, pp. 237-244, vol. CAS-27.

(Continued)

*Primary Examiner*—Huan Hoang
(74) *Attorney, Agent, or Firm*—Eitan Law Group

(57) ABSTRACT

A replenish circuit for a semiconductor memory device, including a bias current generating unit adapted to generate a bias current, a frequency controllable oscillator adapted to receive the bias current and to provide an oscillating output, and a pulse generator adapted to receive the oscillating output and to generate first and second pulses as a function of the oscillating output, the second pulse being embedded in the first pulse, the first pulse causing the bias current generating unit to be connected to a power supply, and the second pulse being fed to sample-and-hold circuitry adapted to sample the bias current and hold the value thereof during the first pulse.

10 Claims, 3 Drawing Sheets

U.S. PATENT DOCUMENTS

| | | |
|---|---|---|
| 5,760,634 A | 6/1998 | Fu |
| 5,808,506 A | 9/1998 | Tran |
| 5,815,435 A | 9/1998 | Van Tran |
| 5,847,441 A | 12/1998 | Cutter et al. |
| 5,880,620 A | 3/1999 | Gitlin et al. |
| 5,903,031 A | 5/1999 | Yamada et al. |
| 5,910,924 A | 6/1999 | Tanaka et al. |
| 5,946,258 A | 8/1999 | Evertt et al. |
| 5,963,412 A | 10/1999 | En |
| 6,005,423 A | 12/1999 | Schultz |
| 6,028,324 A | 2/2000 | Su et al. |
| 6,040,610 A | 3/2000 | Noguchi et al. |
| 6,064,251 A | 5/2000 | Park |
| 6,075,402 A | 6/2000 | Ghilardelli et al. |
| 6,081,456 A | 6/2000 | Dadashev |
| 6,094,095 A | 7/2000 | Murray et al. |
| 6,107,862 A | 8/2000 | Mukainakano et al. |
| 6,118,207 A | 9/2000 | Ormerod et al. |
| 6,130,572 A | 10/2000 | Ghilardelli et al. |
| 6,130,574 A | 10/2000 | Bloch et al. |
| 6,150,800 A | 11/2000 | Kinoshita et al. |
| 6,154,081 A | 11/2000 | Pakkala et al. |
| 6,157,242 A | 12/2000 | Fukui |
| 6,188,211 B1 | 2/2001 | Rincon-Mora et al. |
| 6,198,342 B1 | 3/2001 | Kawai |
| 6,208,200 B1 | 3/2001 | Arakawa |
| 6,246,555 B1 | 6/2001 | Tham |
| 6,285,614 B1 | 9/2001 | Mulatti et al. |
| 6,297,974 B1 | 10/2001 | Ganesan et al. |
| 6,339,556 B1 | 1/2002 | Watanabe |
| 6,665,769 B2 | 1/2002 | Cohen et al. |
| 6,353,356 B1 | 3/2002 | Liu |
| 6,356,469 B1 | 3/2002 | Roohparvar et al. |
| 6,359,501 B2 | 3/2002 | Lin et al. |
| 6,400,209 B1 | 6/2002 | Matsuyama et al. |
| 6,433,624 B1 | 8/2002 | Grossnickle et al. |
| 6,452,438 B1 | 9/2002 | Li |
| 6,577,514 B2 | 6/2003 | Shor et al. |
| 6,608,526 B1 | 8/2003 | Sauer |
| 6,614,295 B2 | 9/2003 | Tsuchi |
| 6,627,555 B2 | 9/2003 | Eitan et al. |
| 6,654,296 B2 | 11/2003 | Jang et al. |
| 6,677,805 B2 | 1/2004 | Shor et al. |
| 6,711,066 B2 * | 3/2004 | Tanzawa et al. ....... 365/185.18 |
| 6,760,262 B2 * | 7/2004 | Haeberli et al. ....... 365/189.09 |
| 2002/0145465 A1 | 10/2002 | Shor et al. |
| 2003/0076159 A1 | 4/2003 | Shor et al. |
| 2003/0202411 A1 | 10/2003 | Yamada |
| 2004/0151034 A1 | 8/2004 | Shor et al. |

FOREIGN PATENT DOCUMENTS

| | | |
|---|---|---|
| EP | 0 843 398 | 5/1998 |
| JP | 02001118392 | 4/2001 |

OTHER PUBLICATIONS

Klinke. et al , "A Very-High-Slew-Rate CMOS Operational Amplifier", IEEE Journal of Solid-State Circuits, 1989, pp. 744-746, vol. 24.

Shor, et al., "paper WA2.04 01—Self regulated Four-Phased Charge Pump with Boosted Wells", ISCAS 2002 2002.

Fotouhi, "An Efficient CMOS Line Driver for 1 544-Mb/s T1 and 2 048-Mb/s E1 Applications", IEEE Journal of Solid-State Circuits, 2003, pp. 226-236, vol. 38.

* cited by examiner

REPLENISHMENT FOR INTERNAL VOLTAGE

FIELD OF THE INVENTION

This invention relates to semiconductor devices requiring replenishment of internal nodes voltage in circuitry that generates internal high voltages.

BACKGROUND OF THE INVENTION

In flash memory devices, such as ones based on NROM (nitride read only memory) technology, a successful read operation should be performed with minimum latency (also known as random access). The read operation involves applying a voltage to the NROM cell gate so that enough read current is flowing in the cell. The cell gate voltage level may be larger then the available VCC supply. For example (although not necessarily), the read voltage level may be around 4 V, whereas the VCC supply may be about 2.7 V. Accordingly, a charge pump circuit is typically used to generate an internal high voltage level to generate the read voltage level.

Since the charge pump operation consumes a significant amount of power, it is undesirable or impossible to keep it running during stand-by mode. Instead, the read voltage is typically maintained and floated by means of a large capacitor in the internal power supply and the charge pump may be switched off. However, the charge on the capacitor tends to leak over time. In order to solve the leakage problem, the charge pump circuitry replenishes the large capacitor of the internal power supply at a pre-defined internal frequency.

One method used in the prior art to replenish the internal power supply is by generating a high-power pulse that activates the internal circuitry. The high-power pulse may be generated by means of an oscillator (e.g., a free running ring oscillator), timer or voltage sensing circuit, for example. As is known in the art, this may require a bias, either in the form of an electric current or voltage or both generated by an external circuit. However, it is problematic to control the frequency and duty cycle of the high-power pulse generation so that the internal power supply is replenished with minimum power dissipation during standby. The capacitor leakage, being the reason for the replenishment, tends to grow exponentially with temperature. This fact imposes greater challenges for solving the problems mentioned above.

Some applications require a variation of the replenishment period as a function of temperature and/or of power supply voltage (usually a shorter period for high temperature and for low voltage). This is commonly accomplished in the art by introducing a temperature and/or supply voltage coefficient to the generator bias, although other schemes are possible.

The replenish pulse forming circuit and some circuits that are fed by the replenish pulse signal are usually designed in such a way as to source a minimum amount of electric current from the power supply between replenish pulses (referred to as the time when the pulse is de-asserted). Maintaining low electric current may extend battery operation life in portable applications, and may reduce heat energy dissipation, thereby extending the operating life and reliability of the system.

FIG. 1 shows a typical block diagram for the prior art implementation described above.

A current bias source 1 generates a DC current 2. The current source 1 generates the current as a function of a power supply voltage 3 and IC (integrated circuit) temperature 4. The bias current from current source 1 drives a ring oscillator 5.

Ring oscillator 5 may comprise three NMOS (n-channel metal oxide semiconductor) transistors 14, 15 and 16, whose gates are all connected to one another. The sources of the NMOS transistors 14, 15 and 16 may be grounded. The drains of the NMOS transistors 14, 15 and 16 are connected as inputs to inverters 17, 18 and 19, respectively (any odd number of inverter may be used). The inverters are connected in series with capacitors 20, 21 and 22, respectively connected to the inverter outputs. The output of inverter 19 is input to inverter 17. The gate of NMOS transistor 14 may be connected to the gate of another NMOS transistor 12. The drain of the NMOS transistor 12 may be connected to its gate, and its source may be grounded.

NMOS transistors 12, 14, 15 and 16 form a current mirror. In a current mirror one transistor is "diode connected", which in the case of MOS transistors means the gate terminal is connected to the drain terminal (as in NMOS transistor 12) and one or more other transistors (NMOS transistors 14, 15 and 16) are connected with their gate terminals to the first transistor's gate while all source terminals are also connected together to the same voltage (such as ground in this example). In this manner, a gate-source voltage is generated between the connected gate terminals and the connected source terminals, and a secondary current is generated in the drain terminals of each of the NMOS transistors 14, 15 and 16.

The output pulse period of ring oscillator 5 shortens in response to a rise in bias current. The oscillator output period is multiplied using a frequency divider 6 and fed to a pulse generator 7, which drives circuitry such as the internal power supply 8, and charges a supply capacitor 10. All of the components 1–8 may be fed DC current from an external power source 9.

However, the bias generating circuit used to generate the high-power pulse must generally remain in operation continuously in order to guarantee generation of succeeding trigger signals that trigger the pulses. The bias circuit typically consumes most of the total supply current at the time when the pulse is de-asserted.

SUMMARY OF THE INVENTION

The present invention seeks to provide a novel replenishment system, such as for circuitry that generates internal high voltages, as is described more in detail hereinbelow. The invention may be used to shut down the bias current and/or voltage bias sources in the period of time between replenish pulses. This may significantly reduce the average standby current consumption necessary for bias generation, while leaving only the trigger generator (e.g., oscillator and the like) and leakage currents as current consumers in the period between replenish pulses.

There is thus provided in accordance with an embodiment of the present invention a replenish circuit for a semiconductor memory device, including a bias current generating unit adapted to generate a bias current, a frequency controllable oscillator adapted to receive the bias current and to provide an oscillating output, and a pulse generator adapted to receive the oscillating output and to generate first and second pulses as a function of the oscillating output, the second pulse being embedded in the first pulse, the first pulse causing the bias current generating unit to be connected to a power supply, and the second pulse being fed to sample-and-hold circuitry adapted to sample the bias current or voltage and hold the value thereof during the first pulse.

In accordance with an embodiment of the present invention the sample-and-hold circuitry may include a diode connected NMOS (n-channel metal oxide semiconductor) transistor with its drain and gate terminals connected to an input current, a capacitor connected to a gate terminal of the NMOS transistor, and another NMOS transistor (or more) whose gate terminal is connected to the gate terminal of the diode connected NMOS transistor, mirroring current to its drain terminal.

Further in accordance with an embodiment of the present invention the sample-and-hold circuitry may include a switch placed between the drain and gate terminals of the diode connected NMOS transistor.

Still further in accordance with an embodiment of the present invention a grounded capacitor may be connected to the gate terminals of the diode connected NMOS transistor and the other NMOS transistor.

In accordance with an embodiment of the present invention a power reset module may be connected to the frequency controllable oscillator.

Further in accordance with an embodiment of the present invention the frequency controllable oscillator may include a plurality of inverters, such as an odd number of inverters.

Still further in accordance with an embodiment of the present invention the pulse generator is adapted to generate the first pulse from a positive edge signal.

In accordance with an embodiment of the present invention the bias current generator unit may include a positive temperature coefficient current.

Further in accordance with an embodiment of the present invention the bias current generator unit may include a band-gap reference circuit.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 2:
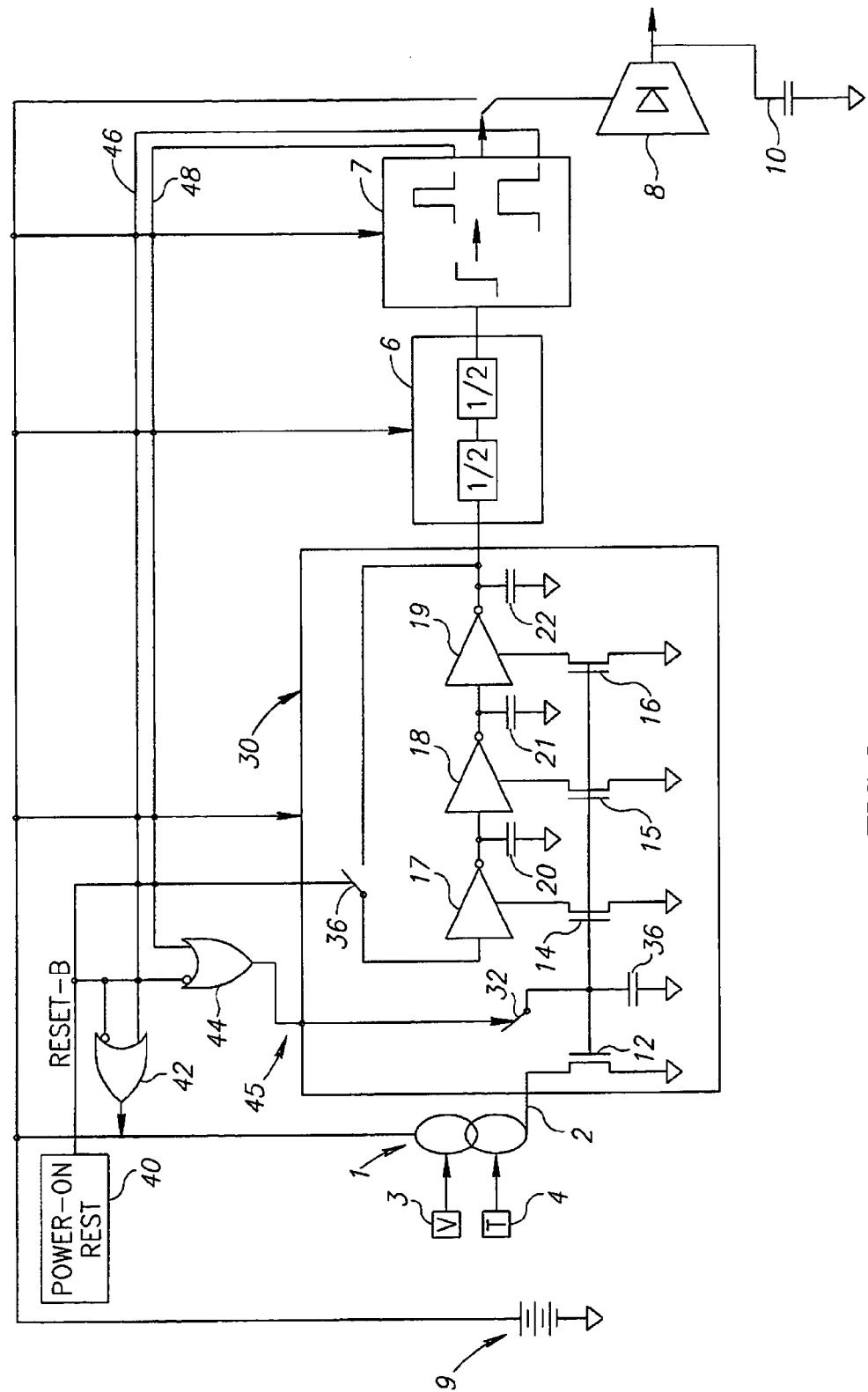
FIG. 2 is a simplified block diagram of a bias generating circuit for generating high-power pulses with self-refreshment, in accordance with an embodiment of the present invention.

Reference is now made to FIG. 2, which illustrates a bias generating circuit for generating high-power pulses with self-refreshment, in accordance with an embodiment of the present invention.

Figure 1:
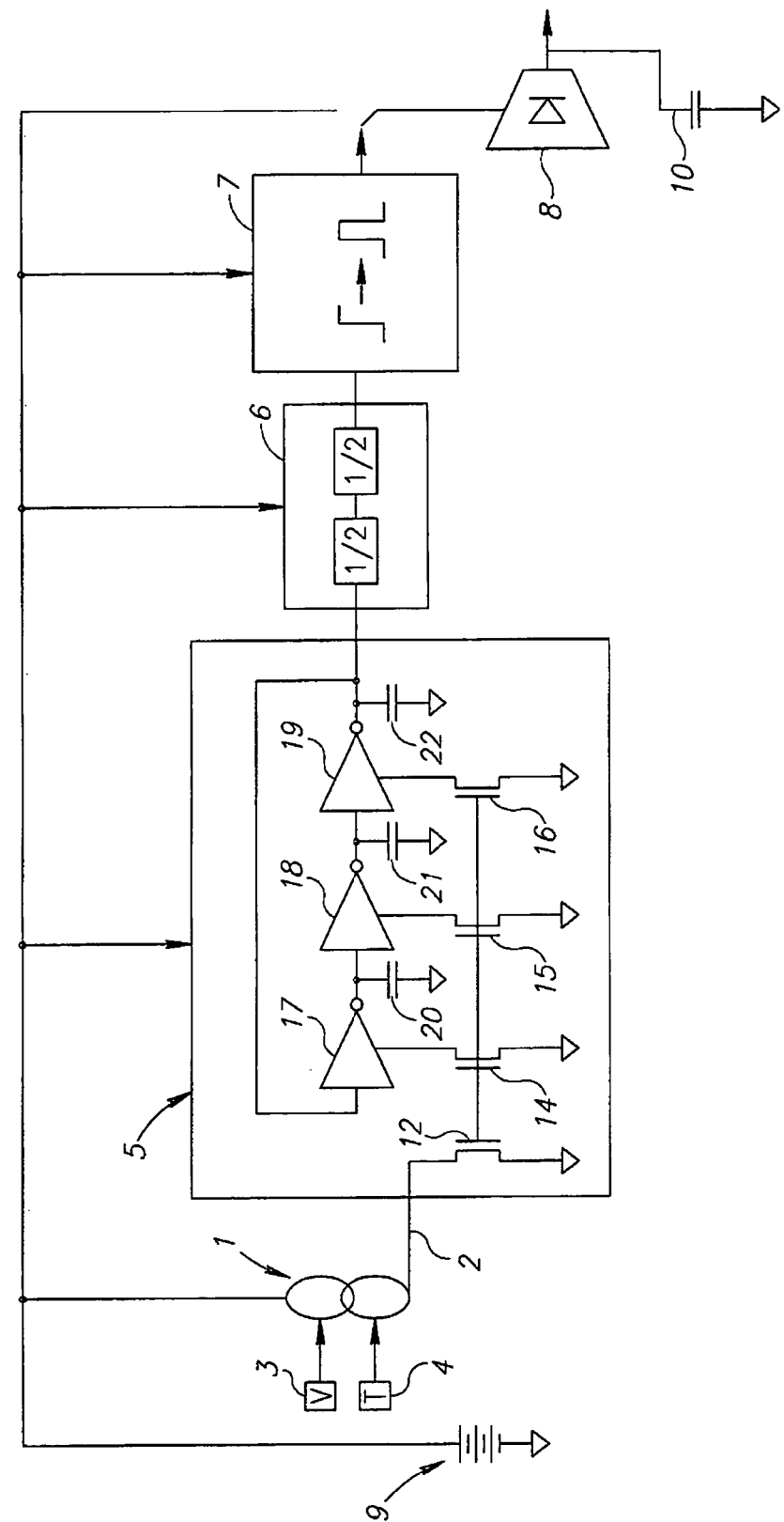
FIG. 1 is a simplified block diagram of a typical prior art bias generating circuit for generating high-power pulses.

For the sake of simplicity, the invention is described and illustrated based on the circuitry of FIG. 1. However, it is emphasized that the invention is not limited to this embodiment and the invention may be carried out with other bias generating circuitry and other pulse generating circuitry.

A bias current generating unit, referred to as a current bias source 1 generates a DC current 2, and may be powered by an external power source 9. As is described in detail hereinbelow, the current bias source 1 may be disconnected and consume only negligible leakage current from the power source 9 throughout the period between successive pulses.

The current source 1 may generate the current as a function of a power supply voltage (V) 3 and IC temperature (T) 4. The current source 1 may include, without limitation, a positive temperature coefficient current. The current source 1 may comprise, without limitation, a band-gap reference circuit. The bias current from current source 1 drives a trigger generator 30, which controls the frequency of pulse generation of a pulse generator 7 by feeding thereto an oscillating output. Trigger generator 30 is also referred to as a frequency controllable oscillator 30. Sample-and-hold circuitry 45 may be implemented with trigger generator 30, as described hereinbelow.

The output pulse period of the trigger generator 30 may shorten in response to a rise in bias current. The output period of the trigger generator 30 may be multiplied using a frequency divider 6 and fed to pulse generator 7, which drives circuitry such as the internal power supply 8, and charges a supply capacitor 10. Components of the bias generating circuit may be fed DC current from the external power source 9.

The trigger generator 30 may comprise, without limitation, three NMOS transistors 14, 15 and 16, whose gates are all connected to one another. The sources of the NMOS transistors 14, 15 and 16 may be grounded. The drains of the NMOS transistors 14, 15 and 16 are connected as inputs to inverters 17, 18 and 19, respectively. The inverters are connected in series with capacitors 20, 21 and 22, respectively connected to the inverter outputs. The output of inverter 19 is input to inverter 17. The gate of NMOS transistor 14 may be connected to the gate of another NMOS transistor 12. The drain of the NMOS transistor 12 may be connected to its gate, and its source may be grounded. The gate of NMOS transistor 14 may be connected to the gate of another NMOS transistor 12. The drain of the NMOS transistor 12 may be connected to its gate, and its source may be grounded. NMOS transistors 12, 14, 15 and 16 form a current mirror.

The sample-and-hold circuitry 45 may be constructed in a variety of manners. In accordance with one non-limiting embodiment of the present invention, a portion of the sample-and-hold circuitry 45 may comprise a switch 32 placed between the drain and gate of the NMOS transistor 12, thereby selectively disconnecting the connection between the drain and gate of the NMOS transistor 12. One of the terminals of switch 32 may be connected to the drain side of NMOS transistor 12, and another terminal of switch 32 may be connected to a node 34 being the gate of NMOS transistors 12,14,15 & 16. A grounded capacitor 36 may be connected to node 34. In addition, another switch 38 may be connected between the output of the inverter 19 (after capacitor 22) and the input of inverter 17. Switch 38 may selectively stop the oscillator during reset. The bias source 1 is controlled via a NOR gate 42 and to switch 32 via a NOR gate 44. The NOR gates 42 and 44 share a common input from the power reset module 40.

The pulse generator 7 may generate two activation pulses, wherein one pulse may be embedded in the other pulse. For example, pulse generator 7 may generate a first pulse 46 from a first signal (e.g., a positive edge signal), and may generate a second pulse 48 bounded in the first pulse 46. The first pulse 46 is input to the NOR gate 42 and controls the bias activation, whereas the second pulse 48 is input to the NOR gate 44 and controls the sample and hold.

It is noted that the invention is not limited to the above-described and illustrated sample-and-hold circuitry 45, and the skilled artisan will readily recognize that other sample-and-hold circuitry may be used for bipolar and other semiconductor technologies.

Whenever pulse generator 7 generates first pulse 46, the current bias source 1 is reconnected to the power supply 9 as the case is with other refreshed circuits. Following a delay intended to allow the bias output sufficient time to stabilize, the second pulse 48 is generated by pulse generator 7 and fed to the sample-and-hold circuit 45, the purpose of which is to sample the bias and hold its value throughout the rest of the self-refresh cycle.

Capacitor 36 remains charged to the bias voltage and the secondary transistors (i.e., NMOS transistors 14, 15 and 16) receive the same gate-source voltage and generate the same drain currents as in the prior art circuitry of FIG. 1, even without being connected to the current bias source 1.

Capacitor 36 may require a periodic refresh of the stored charge in order to compensate for charge lost through leakage currents and in order for the bias source to implement variations in bias current due to variations in temperature and supply voltage, if necessary. In the case of a voltage bias, the bias may be routed through a switch or pass gate (not shown) followed by a parallel capacitor (not shown) which will hold the voltage whenever the switch is open. This scheme may not be suitable if the voltage bias must also supply current, because the capacitor may discharge rapidly.

Figure 3:
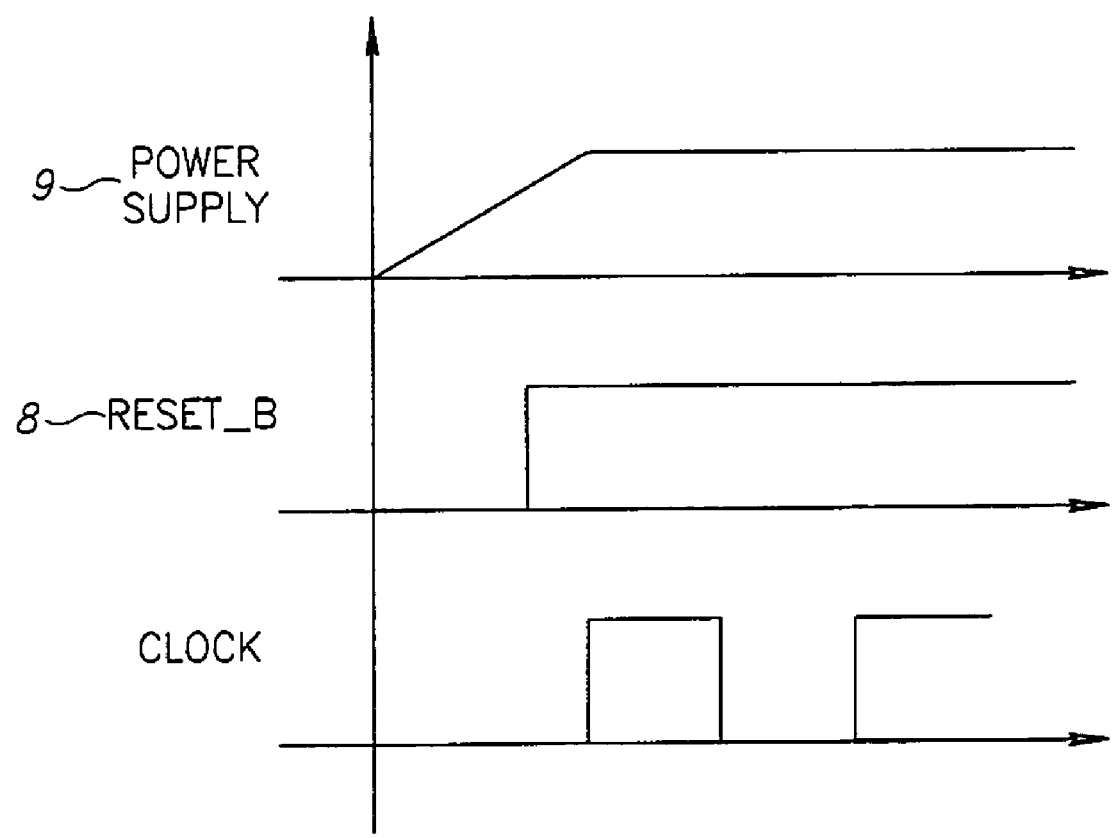
FIG. 3 is a simplified graphical illustration of waveforms for charging a sample-and-hold circuitry of the bias generating circuit of FIG. 2 with an initial sample pulse in accordance with a reset signal, in accordance with an embodiment of the present invention.

In the illustrated embodiment, it may be necessary for an initial sample pulse to charge the sample-and-hold circuitry 45, otherwise the trigger generator 30 may never generate the first self-refresh and the sample-and-hold circuitry 45 may never sample the bias. This requirement can be easily implemented by choosing to activate the trigger generator 30 only after a given reset signal reset_b turns off, and using the same reset signal reset_b for the initial sampling of the capacitor 36. FIG. 3 graphically illustrates the waveforms for charging the sample-and-hold circuitry 45 with the initial sample pulse in accordance with the reset signal reset_b.

It is appreciated that various features of the invention which are, for clarity, described in the contexts of separate embodiments, may also be provided in combination in a single embodiment. Conversely, various features of the invention which are, for brevity, described in the context of a single embodiment, may also be provided separately or in any suitable subcombination.

The invention claimed is:

1. A replenish circuit for a semiconductor memory device, comprising:
   a bias current generating unit adapted to generate a bias current;
   a frequency controllable oscillator adapted to receive said bias current and to provide an oscillating output; and
   a pulse generator adapted to receive the oscillating output and to generate first and second pulses as a function of the oscillating output, the second pulse being embedded in the first pulse, the first pulse causing said bias current generating unit to be connected to a power supply, and the second pulse being fed to sample-and-hold circuitry adapted to sample said bias current and hold the value thereof during said first pulse.

2. The circuit according to claim 1, wherein the sample-and-hold circuitry comprises:
   a diode connected NMOS (n-channel metal oxide semiconductor) transistor with its drain and gate terminals connected to an input current;
   a capacitor connected to a gate terminal of the NMOS transistor; and
   another NMOS transistor whose gate terminal is connected to the gate terminal of said diode connected NMOS transistor, mirroring current to its drain terminal.

3. The circuit according to claim 2, wherein the sample-and-hold circuitry comprises a switch placed between the drain and gate terminals of said diode connected NMOS transistor.

4. The circuit according to claim 2, further comprising a grounded capacitor connected to the gate terminals of the diode connected NMOS transistor and the other NMOS transistor.

5. The circuit according to claim 2, further comprising a power reset module connected to said frequency controllable oscillator.

6. The circuit according to claim 1, wherein the frequency controllable oscillator comprises a plurality of inverters.

7. The circuit according to claim 6, wherein there is an odd number of inverters.

8. The circuit according to claim 1, wherein said pulse generator is adapted to generate the first pulse from a positive edge signal.

9. The circuit according to claim 1, wherein the bias current generator unit comprises a positive temperature coefficient current.

10. The circuit according to claim 1, wherein the bias current generator unit comprises a band-gap reference circuit.

* * * * *